(12) United States Patent
Ahmad et al.

(10) Patent No.: US 9,310,452 B2
(45) Date of Patent: Apr. 12, 2016

(54) SELF-CONSTRAINT NON-ITERATIVE GRAPPA RECONSTRUCTION WITH CLOSED-FORM SOLUTION

(71) Applicant: The Ohio State University, Columbus, OH (US)

(72) Inventors: Rizwan Ahmad, Columbus, OH (US); Yu Ding, Columbus, OH (US); Orlando Simonetti, Columbus, OH (US); Samuel Tze Luong Ting, Columbus, OH (US); Hui Xue, Franklin Park, NJ (US)

(73) Assignee: Ohio State Innovation Foundation, Columbus, OH (US)

( * ) Notice: Subject to any disclaimer, the term of this patent is extended or adjusted under 35 U.S.C. 154(b) by 424 days.

(21) Appl. No.: 13/803,536

(22) Filed: Mar. 14, 2013

(65) Prior Publication Data
US 2013/0278256 A1  Oct. 24, 2013

Related U.S. Application Data

(60) Provisional application No. 61/635,410, filed on Apr. 19, 2012.

(51) Int. Cl.
*G01R 33/561* (2006.01)
*G01R 33/48* (2006.01)

(52) U.S. Cl.
CPC ........ *G01R 33/5611* (2013.01); *G01R 33/4824* (2013.01); *G01R 33/5612* (2013.01)

(58) Field of Classification Search
CPC .......................... G01R 33/5611; G01R 33/5612
USPC .......................................... 324/307, 309, 318
See application file for complete search history.

(56) References Cited

U.S. PATENT DOCUMENTS

| | | | |
|---|---|---|---|
| 7,202,663 B2* | 4/2007 | Huang | 324/307 |
| 8,901,927 B2* | 12/2014 | Gross | 324/309 |
| 2013/0088225 A1* | 4/2013 | Weller et al. | 324/307 |

OTHER PUBLICATIONS

Nana, R. et. al., Automatic Kernel Selection for Optimal GRAPPA Reconstruction, May 24, 2007, ISMRM-ESMRMB, Joint Annual Meeting 2007, 747.*
Zhang, J. et. al., Non-Cartesian Parallel Imaging Reconstruction Using PRUNO-GROG, Dec. 5, 2011, ISMRM, Annual Meeting 2011, 2889.*

(Continued)

*Primary Examiner* — Melissa Koval
*Assistant Examiner* — Rahul Maini
(74) *Attorney, Agent, or Firm* — Meunier Carlin & Curfman LLC (57) ABSTRACT

Parallel magnetic resonance imaging (pMRI) reconstruction techniques are commonly used to reduce scan time by undersampling the k-space data. In GRAPPA, a k-space based pMRI technique, the missing k-space data are estimated by solving a set of linear equations; however, this set of equations does not take advantage of the correlations within the missing k-space data. All k-space data in a neighborhood acquired from a phased-array coil are correlated. The correlation can be estimated easily as a self-constraint condition, and formulated as an extra set of linear equations to improve the performance of GRAPPA. We propose a modified k-space based pMRI technique call self-constraint GRAPPA (SC-GRAPPA) which combines the linear equations of GRAPPA with these extra equations to solve for the missing k-space data. Since SC-GRAPPA utilizes a least-squares solution of the linear equations, it has a closed-form solution that does not require an iterative solver.

13 Claims, 7 Drawing Sheets

(56) References Cited

OTHER PUBLICATIONS

Lustig, M., et al., "SPIRIT: Iterative self-consistent parallel imaging reconstruction from arbitrary k-space," Magn. Reson. Med., vol. 64, 2010, pp. 457-471.

Zhao, T., et al., "Iterative GRAPPA (iGRAPPA) for improved parallel imaging reconstruction," Magn. Reson. Med., vol. 59, 2008, pp. 903-907.

Zhang, J., et al., "Parallel reconstruction using null operations," Magn. Reson. Med., vol. 66, 2011, pp. 1241-1253.

\* cited by examiner

SELF-CONSTRAINT NON-ITERATIVE GRAPPA RECONSTRUCTION WITH CLOSED-FORM SOLUTION

CROSS-REFERENCE TO RELATED APPLICATION

This application claims priority to U.S. Provisional Patent Application No. 61/635,410, filed Apr. 19, 2012, entitled "SELF-CONSTRAINT NON-ITERATIVE GRAPPA RECONSTRUCTION WITH CLOSED-FORM SOLUTION," which is incorporated herein by reference in its entirety.

BACKGROUND

Parallel magnetic resonance imaging (pMRI) techniques reduce scan time by undersampling k-space; this directly improves temporal resolution in real-time cine imaging and other applications. GeneRalized Autocalibrating Partially Parallel Acquisition (GRAPPA), a k-space based pMRI technique, is widely used clinically for magnetic resonance imaging (MRI) because of its robustness. It estimates the missing k-space points by solving a set of linear equations; however, this method does not take advantage of the correlations within the missing k-space data. In reality, all k-space data within a neighborhood are correlated. These correlations can be formulated as additional self-constraint conditions, which are not considered in standard GRAPPA. While it has been established that incorporating these self-constraints in parallel reconstruction greatly improves the image quality, this has only been previously demonstrated using iterative solutions.

Conventional solutions utilize linear constraints with iterative solvers to improve the performance of GRAPPA reconstruction. For example, Zhao and Hu proposed to estimate a self-constraint kernel that utilizes the reconstructed lines to interpolate the acquired lines (iGRAPPA) (see, T. Zhao and X. Hu, "Iterative GRAPPA (iGRAPPA) for improved parallel imaging reconstruction," Magn Reson Med 59, 903-907 (2008)). Lustig and Pauly proposed the SPIRiT technique, which exploits the correlations in k-space by applying a full neighborhood kernel (see, M. Lustig and J. M. Pauly, "SPIRiT: Iterative self-consistent parallel imaging reconstruction from arbitrary k-space," Magn Reson Med 64, 457-471 (2010)). Zhang et al. proposed the PRUNO technique, which uses the null-space method to take advantage of k-space correlations (see, J. Zhang, C. Liu and M. E. Moseley, "Parallel reconstruction using null operations," Magn Reson Med 66, 1241-1253 (2011)).

However, these methods do not have closed-form solutions, and the corresponding reconstruction problem can only be solved using iterative solvers. There are some ubiquitous difficulties associated with iterative methods. First, defining an appropriate stopping criterion can be problematic; second, convergence may not be guaranteed; and third, these methods are computationally demanding and real-time reconstruction may be infeasible.

SUMMARY

Systems and methods for self-constraint GRAPPA (SC-GRAPPA) reconstruction that provides a non-iterative, closed-form solution. The constraints are formulated as a set of homogeneous linear equations. The SC-GRAPPA reconstruction solves the combination of traditional GRAPPA equations and the extra set of equations created by the self-constraint condition. Using the simple least-squares principle, a closed-form solution is derived without introducing any free parameters or regularization terms. Similar to GRAPPA, the SC-GRAPPA method can be applied using a k-space sliding window and therefore is a direct extension of GRAPPA with self-constraints.

In accordance with some implementations, there is provided a method of determining a Self-Constraint (SC) GeneRalized Autocalibrating Partially Parallel Acquisition (GRAPPA) reconstruction. The method includes sampling k-space data on a set of autocalibration signal (ACS) lines acquired from an MRI apparatus; estimating a GRAPPA kernel from the ACS lines; estimating a null projection matrix N from the ACS lines; performing a GRAPPA reconstruction to calculate $k_0$, which represents the GRAPPA reconstruction; and calculating a k-space of the SC-GRAPPA.

In accordance with some implementations, an apparatus for determining a Self-Constraint (SC) GeneRalized Autocalibrating Partially Parallel Acquisition (GRAPPA) reconstruction is provided. The apparatus includes a memory and a processor executing computer executable instructions in the memory, the computer executable instructions. The apparatus samples k-space data from an MRI apparatus, and part of the k-space data is a set of ACS lines, estimates a GRAPPA kernel from the ACS lines, estimates a null projection matrix N, performs a GRAPPA reconstruction to calculate $k_0$, and calculates a k-space of the SC-GRAPPA.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

The components in the drawings are not necessarily to scale relative to each other. Like reference numerals designate corresponding parts throughout the several views.

DETAILED DESCRIPTION

The present disclosure provides example implementation for Parallel MRI (pMRI) reconstruction techniques that reduce scan time by undersampling k-space that estimate the missing k-space points by solving a set of linear equations by taking advantage of the correlations within the missing k-space data. As all k-space data within a neighborhood are correlated, these correlations can be estimated and regarded as self-constraint conditions which are not considered in GRAPPA. Disclosed herein is a process that incorporates these self-constraints in a parallel reconstruction, without requiring an iterative solver.

In particular, the present disclosure provides an approach to self-constraint GRAPPA (SC-GRAPPA) reconstruction that provides a non-iterative, closed-form solution. The constraints are formulated as a set of homogeneous linear equations. The SC-GRAPPA reconstruction solves the combination of traditional GRAPPA equations and an extra set of equations created by the self-constraint condition. Using the simple least-squares principle, a closed-form solution is derived without introducing any free parameters or regularization terms. Similar to GRAPPA, the SC-GRAPPA method can be applied using a k-space sliding window and therefore is a direct extension of GRAPPA with self-constraints.

Figure 1:
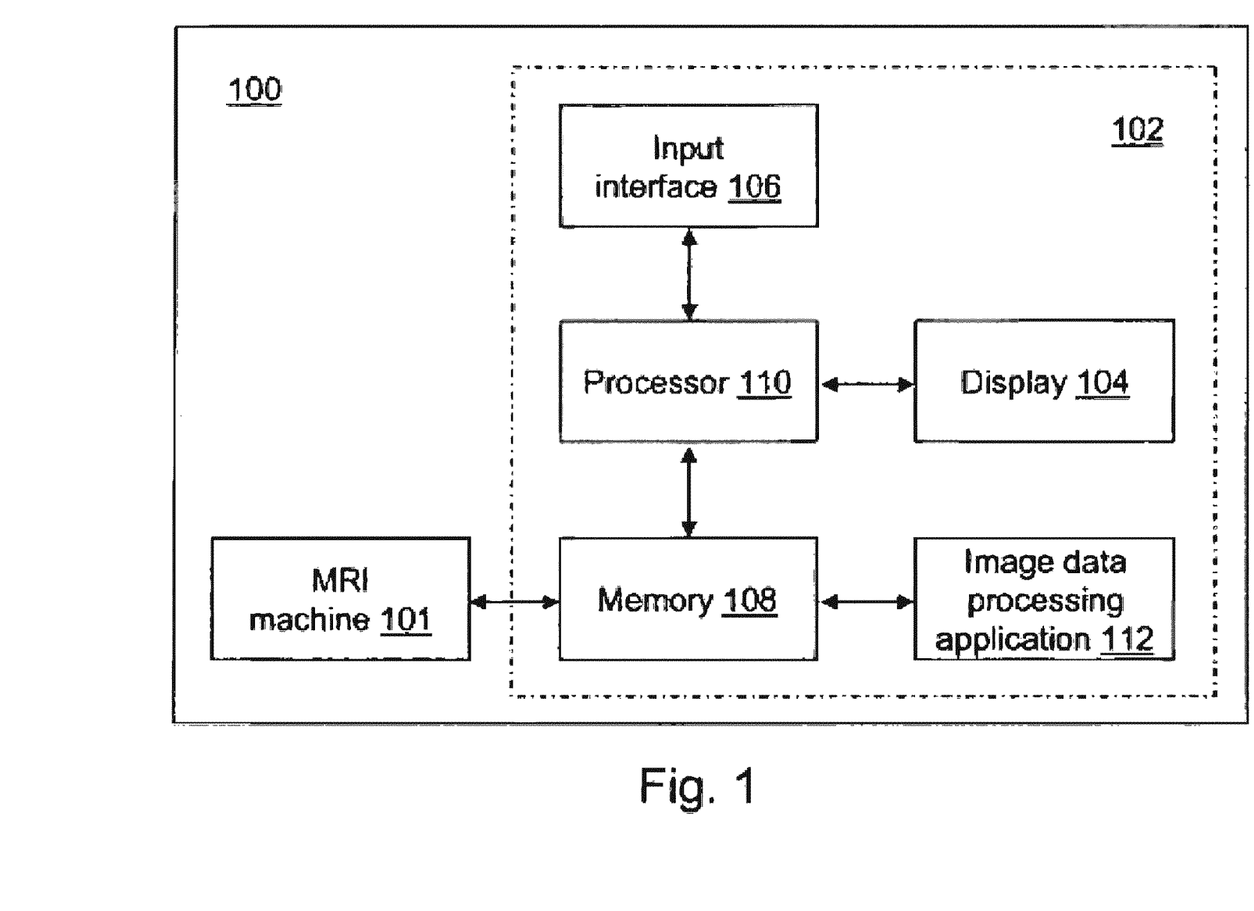
FIG. 1 illustrates a block diagram of an example MRI data processing system.

With reference to FIG. 1, there is illustrated a block diagram of an MRI data processing system 100 is shown in accordance with an exemplary implementation. MRI data processing system 100 may include a magnetic resonance imaging (MRI) apparatus 101 and a computing device 102. Computing device 102 may include a display 104, an input interface 106, a memory 108, a processor 110, and an image data processing application 112. In the embodiment illustrated in FIG. 1, MRI machine 101 generates MRI image data.

Computing device 102 may be a computer of any form factor. Different and additional components may be incorporated into computing device 102. Components of MRI data processing system 100 may be positioned in a single location, a single facility, and/or may be remote from one another. As a result, computing device 102 may also include a communication interface, which provides an interface for receiving and transmitting data between devices using various protocols, transmission technologies, and media as known to those skilled in the art. The communication interface may support communication using various transmission media that may be wired or wireless.

Display 104 presents information to a user of computing device 102 as known to those skilled in the art. For example, display 104 may be a thin film transistor display, a light emitting diode display, a liquid crystal display, or any of a variety of different displays known to those skilled in the art now or in the future.

Input interface 106 provides an interface for receiving information from the user for entry into computing device 102 as known to those skilled in the art. Input interface 106 may use various input technologies including, but not limited to, a keyboard, a pen and touch screen, a mouse, a track ball, a touch screen, a keypad, one or more buttons, etc. to allow the user to enter information into computing device 102 or to make selections presented in a user interface displayed on display 104. Input interface 106 may provide both an input and an output interface. For example, a touch screen both allows user input and presents output to the user.

Memory 108 is an electronic holding place or storage for information so that the information can be accessed by processor 110 as known to those skilled in the art. Computing device 102 may have one or more memories that use the same or a different memory technology. Memory technologies include, but are not limited to, any type of RAM, any type of ROM, any type of flash memory, etc. Computing device 102 also may have one or more drives that support the loading of a memory media such as a compact disk or digital video disk.

Processor 110 executes instructions as known to those skilled in the art. The instructions may be carried out by a special purpose computer, logic circuits, or hardware circuits. Thus, processor 110 may be implemented in hardware, firmware, software, or any combination of these methods. The term "execution" is the process of running an application or the carrying out of the operation called for by an instruction. The instructions may be written using one or more programming language, scripting language, assembly language, etc. Processor 110 executes an instruction, meaning that it performs the operations called for by that instruction. Processor 110 operably couples with display 104, with input interface 106, with memory 108, and with the communication interface to receive, to send, and to process information. Processor 110 may retrieve a set of instructions from a permanent memory device and copy the instructions in an executable form to a temporary memory device that is generally some form of RAM. Computing device 102 may include a plurality of processors that use the same or a different processing technology.

Image data processing application 112 performs operations associated with performing parallel image reconstruction of undersampled image data in k-space. Some or all of the operations subsequently described may be embodied in image data processing application 112. The operations may be implemented using hardware, firmware, software, or any combination of these methods. With reference to the exemplary embodiment of FIG. 1, image data processing application 112 is implemented in software stored in memory 108 and accessible by processor 110 for execution of the instructions that embody the operations of image data processing application 112. Image data processing application 112 may be written using one or more programming languages, assembly languages, scripting languages, etc.

MRI machine 101 and computing device 102 may be integrated into a single system such as an MRI machine. MRI machine 101 and computing device 102 may be connected directly. For example, MRI machine 101 may connect to computing device 102 using a cable for transmitting information between MRI machine 101 and computing device 102. MRI machine 101 may connect to computing device 102 using a network. MRI images may be stored electronically and accessed using computing device 102. MRI machine 101 and computing device 102 may not be connected. Instead, the MRI data acquired using MRI machine 101 may be manually provided to computing device 102. For example, the MRI data may be stored on electronic media such as a CD or a DVD. After receiving the MRI data, computing device 102 may initiate processing of the set of images that comprise an MRI study.

With the introduction above and example operating environment, below is an introduction to the self-constraint GRAPPA (SC-GRAPPA) reconstruction of the present disclosure that provides a non-iterative, closed-form solution.

Background of GRAPPA Reconstruction

The GRAPPA technique is a k-space channel-by-channel reconstruction method. The unacquired k-space data of each channel are estimated by interpolating the acquired k-space data of all channels within the neighborhood. Therefore, GRAPPA can be performed using convolution in k-space or can be computed efficiently in the image domain using pixel-wise multiplication. The convolution kernel can be estimated from a set of fully sampled k-space lines, called automatic calibration signal (ACS) lines. The GRAPPA method uses a relatively small convolution kernel which is estimated using linear regression instead of computing directly from the sensitivity maps.

It is well-accepted that GRAPPA is more robust than the Sensitivity Encoding (SENSE) technique; GRAPPA can tolerate a relatively large motion mismatch between the ACS lines and the down-sampled k-space lines without generating severe artifacts. While GRAPPA reconstruction is widely used in real-time cardiac imaging because GRAPPA is robust to inaccurate ACS lines, it has one shortcoming: GRAPPA has lower signal-to-noise ratio (SNR) than SENSE reconstruction. In particular, it has been observed that SENSE provides better SNR when the coil sensitivity map is accurate and therefore shows slightly better image quality than GRAPPA. When the coil sensitivity map has error, severe ghosting artifacts appear in SENSE reconstruction.

GRAPPA reconstruction uses the acquired k-space data as the only input, and the output is an estimate of the missing k-space data. For an arbitrary k-space neighborhood, the GRAPPA technique can be represented by the following equation:

$$k_{unacq} = g \otimes k_{acq}, \quad (1.a)$$

where $k_{unacq}$ and $k_{acq}$ are vectorized unacquired and acquired k-space data, respectively, g is the GRAPPA kernel, and $\otimes$ represents convolution. Since the convolution operation can be represented as a matrix multiplication, Eq. (1) can be written as a matrix equation:

$$\begin{bmatrix} 0 & 0 \\ G_{21} & -I \end{bmatrix} \begin{bmatrix} k_{acq} \\ k_{unacq} \end{bmatrix} = \begin{bmatrix} 0 \\ 0 \end{bmatrix}, \quad (1.b)$$

where $G_{21}$ is the GRAPPA kernel convolution matrix, and I is the identity matrix. Each element of Eq. (1.b) is a block.

k-space Self-constraint Condition

All k-space data have local correlations. These correlations can be represented by a set of extra equations that are not included in standard GRAPPA (1). The method of the present disclosure incorporates these equations to generate a new (larger) set of equations. Image reconstruction may be performed by finding the optimal solution to the new set of equations. Three recently published papers proposed different approaches to assemble the equations which originate from the local k-space correlations. In the following sections, the three techniques are reviewed, followed by a description of the self-constraint GRAPPA.

Iterative GRAPPA (iGRAPPA) is a method that uses missing data to interpolate the acquired data as a self-constraint condition that can be summarized using the following matrix equations:

$$\begin{bmatrix} k_{acq} \\ k_{unacq} \end{bmatrix} = \begin{bmatrix} 0 & G_{12} \\ G_{21} & 0 \end{bmatrix} \begin{bmatrix} k_{acq} \\ k_{unacq} \end{bmatrix} \quad (2)$$

where $G_{21}$ is the GRAPPA kernel convolution matrix (identical to Eq. (1.b)), and the $G_{12}$ is the matrix that represents the self-constraint condition.

SPIRiT (iterative self-consistent parallel imaging reconstruction) utilizes a full-neighborhood kernel to interpolate the unacquired k-space data. Mathematically, SPIRiT can also be written as a self-constraint condition where each sample in k-space, acquired or unacquired, can be represented by a weighted sum of neighboring acquired and unacquired samples, yielding:

$$\begin{bmatrix} k_{acq} \\ k_{unacq} \end{bmatrix} = \begin{bmatrix} S_{11} & S_{12} \\ S_{21} & S_{22} \end{bmatrix} \begin{bmatrix} k_{acq} \\ k_{unacq} \end{bmatrix} \quad (3.a)$$

or $$\begin{bmatrix} S_{11} - I & S_{12} \\ S_{21} & S_{22} - I \end{bmatrix} \begin{bmatrix} k_{acq} \\ k_{unacq} \end{bmatrix} = \begin{bmatrix} 0 \\ 0 \end{bmatrix} \quad (3.b)$$

The matrix S is the SPIRiT convolution kernel. Eq. (1) and Eq. (2) can be considered as special cases of Eq. (3). The matrices G and S in Eq. (2) and Eq. (3), respectively, can both be estimated using linear regression of the ACS lines, similar to the GRAPPA kernel estimation procedure.

Another method that utilizes k-space correlations is PRUNO (parallel reconstruction using null operations). In PRUNO formulation, every k-space neighborhood can be projected onto a null space by the same projection matrix N:

$$\begin{bmatrix} N_{11} & N_{12} \\ N_{21} & N_{22} \end{bmatrix} \begin{bmatrix} k_{acq} \\ k_{unacq} \end{bmatrix} = \begin{bmatrix} 0 \\ 0 \end{bmatrix} \quad (4)$$

Instead of the linear regression method, PRUNO uses singular value decomposition (SVD) to estimate the projection matrix N.

The similarity of Eq. (2), Eq. (3) and Eq. (4) indicates how all three methods take advantage of the local k-space correlations among acquired and unacquired samples that GRAPPA does not. Both SPIRiT and PRUNO use full k-space kernels, and iGRAPPA uses kernels that either span the acquired or the unacquired k-space lines. In other words, SPIRiT and PRUNO are able to exploit more generic correlations than iGRAPPA. However, both SPIRiT and PRUNO utilize iterative solvers for image reconstruction.

There are differences, however, between SPIRiT and PRUNO. First, two different mathematical tools are used to solve these equations, i.e., linear regression for SPIRiT vs. SVD for PRUNO. Second, the number of equations is different. The number of rows of Eq. (4) is higher than that of Eq. (3); PRUNO results in more equations because it utilizes the null-space kernels to interpolate k-space. The number of null-space kernels can be considerably larger than the number of channels. In contrast, the SC-GRAPPA of the present disclosure uses GRAPPA reconstruction as a prior and uses PRUNO equations as the self-constraint condition.

Self-constraint GRAPPA (SC-GRAPPA) Reconstruction

Unlike iGRAPPA/SPIRiT/PRUNO, the SC-GRAPPA method has a closed-form solution. There are two mathematical methods that can be used to formulate this problem; the first is a convex optimization with linear constraints, and the second is the least squares (LS) problem with prior estimation. It can be proven that the second approach is more generic.

The linear equations of SC-GRAPPA are as follows:

$$k = k_0 + w \quad (5.a)$$

$$0 = Nk + v \quad (5.b)$$

where $k_0$ in Eq. (5.a) represents the GRAPPA reconstruction, used as the prior estimation. Both k and $k_0$ are vectorized local k-space data. Eq. (5.b) is the self-constraint condition from PRUNO. The definition of matrix N is the same as Eq. (4). Both w, v are random noise terms with covariance matrices Q and R, respectively.

From Eq. (5), there are two intuitive ways to formulate the self-constraint condition: it can either be formulated as a problem of convex optimization with linear constraints, or as a least squares problem with prior estimation. In the following section, we will manifest both formulations and reveal the relation between them.

The corresponding convex optimization problem with linear constraint:

$$\min_x \tfrac{1}{2}\|k-k_0\|^2 \text{ s.t. } Nk=b \quad (A.1)$$

where $k$, $k_0$, $b$ and $N$ are vectors and matrix in the complex domain. $N^H$ represents the Hermitian transpose of matrix $N$. Eq. (A.1) can be solved using the Lagrange method, generating the following linear equations:

$$\begin{bmatrix} I & -N^H \\ -N & 0 \end{bmatrix}\begin{bmatrix} k \\ \lambda \end{bmatrix} = \begin{bmatrix} k_0 \\ -b \end{bmatrix} \quad (A.2)$$

with solution:

$$\begin{bmatrix} k \\ \lambda \end{bmatrix} = \begin{bmatrix} (I - N^H(NN^H)^{-1}N)k_0 + N^H(NN^H)^{-1}b \\ -(NN^H)^{-1}Hk_0 + (NN^H)^{-1}b \end{bmatrix}, \quad (A.3)$$

which can be written as:

$$k = k_0 + N^H(NN^H)^{-1}(b - Nk_0). \quad (A.4)$$

The alternative formulation is the least-squares problem with prior estimation:

$$k_0 = k + w \quad (A.5)$$

$$b = Nk + v,$$

where $w$ and $v$ are random noise terms, representing the uncertainties in both equations. In matrix form:

$$\begin{bmatrix} b \\ k_0 \end{bmatrix} = \begin{bmatrix} N \\ I \end{bmatrix} k + \begin{bmatrix} v \\ w \end{bmatrix}. \quad (A.6)$$

Assuming that the noise covariance matrix can be written as:

$$P = \begin{bmatrix} Q & 0 \\ 0 & R \end{bmatrix}. \quad (A.7)$$

A linear unbiased estimation is:

$$k = (N^H Q^{-1} N + R^{-1})^{-1}(N^H Q^{-1} b + R^{-1} k_0) \quad (A.8)$$
$$= k_0 + RN^H (Q + NRN^H)^{-1}(b - Nk_0).$$

The second formulation can be converted back to the first formulation under proper assumptions, if there are two preconditions:

$$(I + NN^H)^{-1} = (NN^H)^{-1}((NN^H)^{-1} + I)^{-1} \approx (NN^H)^{-1}, \quad (A.9.a)$$

$$Q = R = I, \quad (A.9.b)$$

then Eq. (A.8) can be rewritten as:

$$k = k_0 + N^H(NN^H)^{-1}(b - Nk_0), \quad (A.10)$$

which is exactly the same as Eq. (A.4). Eq. (A.8) is a more general form of Eq. (A.4).

Thus, according to Eq. (A.5) to Eq. (A.8), the LS solution of Eq. (5) is:

$$k = k_0 - RN^T(Q + NRN^T)^{-1}Nk_0 \quad (6)$$

To estimate the covariance matrices $Q$ and $R$, these may be set as the identity matrix for purposes of simplicity. Eq. (6) can be implemented as a convolution in k-space, and can be calculated in every local k-space neighborhood using a sliding window. Since each k-space data point can be assessed multiple times when a sliding window is applied, a simple average is used to reach the final result. For example, if a 5×5 sliding window is selected, and an 8-channel phase-array coil is used, then the input $k_0$ in Eq. (6) is a 1-D vector with dimension 1×200, and the output k is a 1-D vector of the same size. If the full k-space dimension is 128×128, then the k-space data can be vectorized as 16384 1-D vectors, each with dimension 1×200. Because each k-space point appears in exactly 25 vectors, and each may have a different value, the final result will be the average of these 25 values.

The SC-GRAPPA results in higher noise suppression in image regions with lower SNR. In the high SNR regions, the signal content usually satisfies the self-constraint condition automatically, and applying the additional self-constraint condition may not lead to significant improvement. In the low SNR regions, the random noise does not satisfy the self-constraint condition, and applying the additional self-constraint condition shows stronger noise reduction effect. This property may help improve the local image SNR in regions where signal penetration is problematic.

There is a generic trade-off between the artifact level and the SNR. Typically, any improvement in SNR comes with a corresponding increase in artifact level. As detailed below in a phantom study, more aggressive selection of the null-space dimension lead to higher aliasing/artifacts, but lower random noise. In-vivo experiments demonstrated that SC-GRAPPA improves both SNR and artifact over GRAPPA when the null-space selection was simply set to the number of phased-array coil channels.

Thus, optimal selection of the sliding window size and the null-space dimension should improve the performance of SC-GRAPPA. However, there are no well-established methods to optimally select either parameter. The same problem also exists in the SPIRiT and PRUNO techniques. As such, the SC-GRAPPA method of the present disclosure depends on the sliding window size and null-space dimension of the PRUNO method, but is not sensitive to either parameter. In fact, SC-GRAPPA showed significant improvement over GRAPPA for all three sliding window sizes: 7×7, 9×9 and 11×11. In addition, the RMSE vs. the selection of the null-space dimension curve is rather flat. This indicates that even a sub-optimal null-space dimension selection in SC-GRAPPA would still have lower RMSE and higher SNR than GRAPPA. Therefore, a relatively conservative null-space selection and a relatively large sliding window may be adopted to provide an improvement over GRAPPA reconstruction.

The performance of SC-GRAPPA can be further improved by incorporating additional data to fine tune the parameters. For example, if two sets of ACS lines are available, the cross-validation method can be used to find the optimal sliding window size and the modes of the null-space selection; one set of ACS lines can be used for calibration and the other set of ACS lines can be used for reconstruction validation. The optimal parameters can be determined by finding the minimal residual. As a practical approach, several pre-scan low-resolution images with variant slice location/orientation may also be used to further optimize the parameters.

Figure 2:
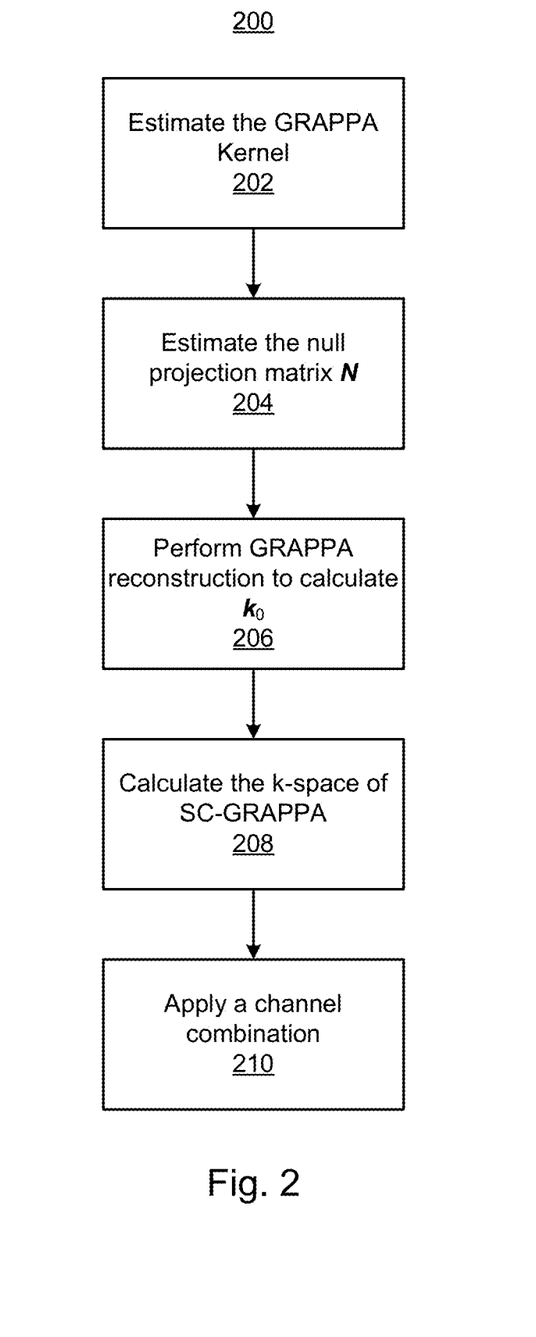
FIG. 2 illustrates an example operational flow for the computation of the SC-GRAPPA reconstruction.

With reference to FIG. 2, there is illustrated an example operational flow 200 for the computation of the SC-GRAPPA reconstruction. At 202, the GRAPPA kernel is estimated from ACS lines. At 204, the null projection matrix N is estimated from ACS lines. At 206, the GRAPPA reconstruction is performed to calculate $k_0$. At 208, a k-space of SC-GRAPPA is calculated. For example, Eq. (6) above may be used to calculate the k-space. At 210, the channel combination is applied using either the sum-of-squares or B1-weighted summation.

In a prototype SC-GRAPPA implementation, the reconstruction was performed either in k-space, or in image space. Experiments showed that the computational time was relatively low by implementing the k-space convolution as an image space point-wise multiplication. Thus, in summary, the present disclosure presents a new framework to combine the self-constraint condition with the GRAPPA technique to improve the reconstructed image quality using a closed-form solution. This proposed framework combines GRAPPA with other linear constraints given in, e.g., Eq. (5.b).

Methods

A. Phantom Study

Seventeen time frames were acquired from the coronal orientation slice of two spherical water bottles using a steady-state free precession (SSFP) real-time cine sequence with no parallel acceleration. Detailed parameters for the SSFP sequence were: flip angle=70°, TE=1.15 ms, TR=2.28 ms, pixel bandwidth=1502 Hz/pixel, matrix size=128×120, field of view (FOV)=400×375 mm², and slice thickness=5.0 mm.

The first frame of the image series was used for the ACS lines for GRAPPA, CG-PRUNO, and SC-GRAPPA. The remaining 16 fully sampled frames were uniformly down-sampled and then reconstructed using GRAPPA, CG-PRUNO, and SC-GRAPPA. All reconstructions were tested for every possible k-space trajectory, e.g., for R=6, all six possible uniform down-sampled k-space trajectories were reconstructed. The kernel size used in GRAPPA reconstruction was 4×5; the kernel size used in SC-GRAPPA reconstruction was 7×7; and the sliding window sizes used in null-space selection were 7×7, 9×9 and 11×11. Using the corresponding fully sampled k-space as the gold standard, the root-mean-square-error (RMSE) of the reconstructed k-space was evaluated as a metric to measure the fidelity of both reconstructions. Since there is no well-established method to find the optimal dimension of the null-space, we plotted the RMSE vs. null-space dimension selection to study it qualitatively. Both GRAPPA and SC-GRAPPA reconstructions and the corresponding RMSE measurement were repeated using the conventional GRAPPA acquisition pattern. Forty ACS lines in the center of k-space were fully sampled, and the rest of k-space was uniformly down-sampled (please note that this strategy reduces the effective acceleration rate).

B. In-vivo Real-Time Cardiac MR Cine Images

SC-GRAPPA was tested in multiple cardiac views in two healthy volunteers. MR real-time cardiac cine images with uniformly down-sampled temporally-interleaved k-space were reconstructed using both GRAPPA and SC-GRAPPA. We acquired two SSFP real-time cine series using TGRAPPA with parallel acceleration rates R=5 and R=6, in vertical and horizontal long-axis, and one short-axis views. Imaging parameters (for R=5/6) were 192×95/96 matrix reconstructed from 192×15/16 acquired matrix, 6 mm thick slice, flip angle=48°, TE/TR=1.0/2.56 ms, pixel bandwidth=1447 Hz/pixel, FOV=380×285 mm². A total of 256 frames were acquired per image series to support statistical analysis. The ACS lines were generated using average-all-frames. A 7×7 sliding window size was used in the volunteer study. The null-space selection was set to be the same as the number of channels, i.e. only 32 modes belong to signal-space, and all other modes belong to null-space.

After reconstruction, the signal was estimated as the temporal mean. The noise level of images was evaluated using the MP-law method based on the random matrix theory. The Karhunen-Loeve transform was applied along the temporal direction, and the noise-only eigenimages were identified by assuming they follow a specific distribution function, i.e., the Marcenko-Pastur law. Once identified, the noise level can be accurately estimated from the noise-only eigenimages. The image artifact level was estimated using a spatial cross-correlation based method. A template including 1% of the highest signal pixels was generated for each frame, typically comprising the brightest subcutaneous fat of the chest wall. An artifact score was defined as the cross-correlation coefficient evaluated between the template and the corresponding frame at phase encoding FOV/R (where R is the acceleration rate).

In the studies described below, phantom and human images were acquired on a 1.5T MRI system (MAGNETOM Avanto, Siemens Healthcare Inc., Erlangen, Germany). A 32-channel cardiac array coil (Quality Electrodynamics, Mayfield Village, Ohio) was used for data acquisition. The SC-GRAPPA method was implemented and all images processed using Matlab® 2011a (MathWorks, Natick, Mass.) running on a computer with Intel® Xeon® E5620 2.4 GHz CPU, 40 GB system RAM. Utilizing Eq. (6), the SC-GRAPPA reconstruction can be computed in k-space using a sliding window. The convolution operation in Eq. (6) was implemented in image space as a pixel-wise multiplication to avoid the time-consuming k-space convolution and thereby increase the speed of reconstruction significantly[6]. This image space implementation is a direct application of the convolution theorem. The conjugate gradient (CG)-PRUNO algorithm without regularization terms was also implemented in Matlab using a 7×7 kernel and applied in the phantom study to provide a comparison with another self-constraint reconstruction method.

IV Results

A. Phantom Study

Figure 3:
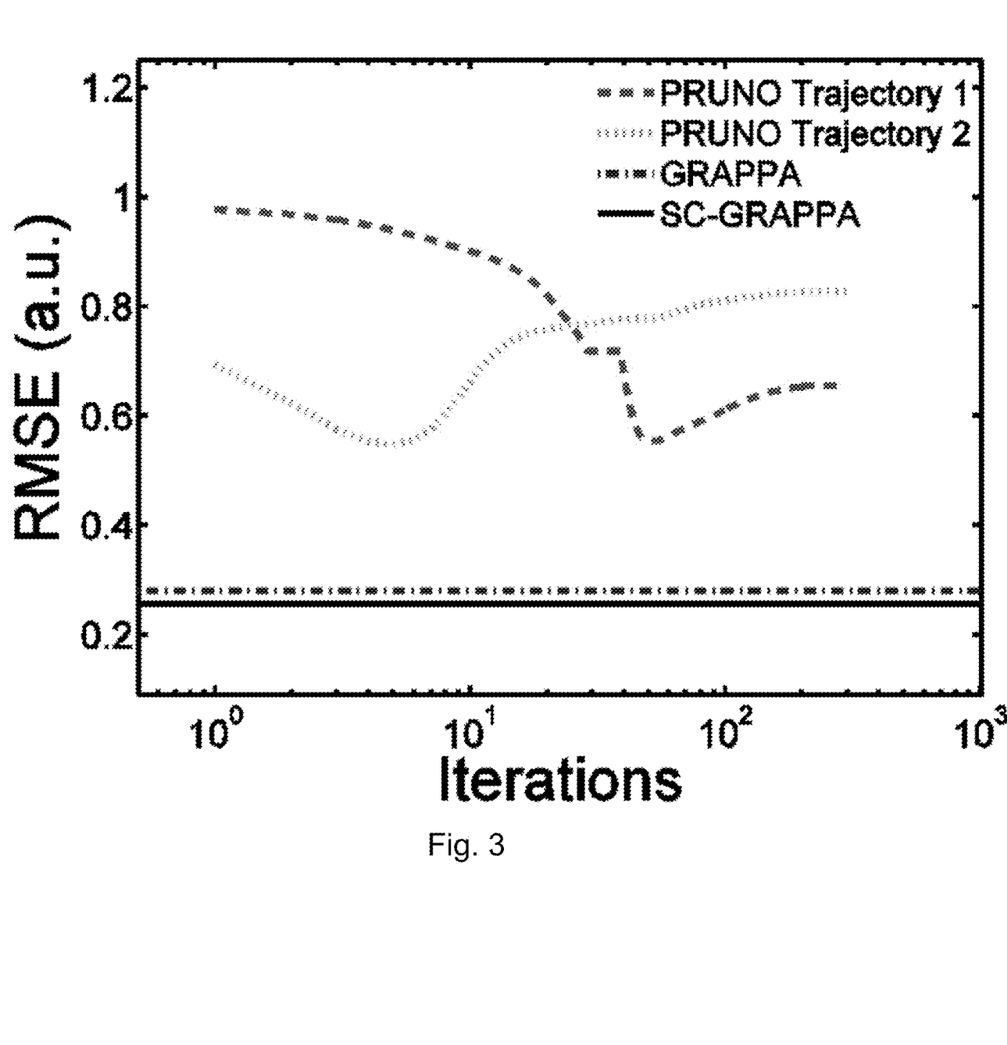
FIG. 3 shows the RMSE vs. iterations of CG-PRUNO in a phantom with acceleration rate R=6.

FIG. 3 shows the RMSE vs. iterations of CG-PRUNO in a phantom with acceleration rate R=6. For CG-PRUNO reconstruction, the RMSE is consistently worse than GRAPPA reconstruction, regardless of the null-space selection. In addition, large fluctuation was observed among different k-space trajectories (>20%). However, the SC-GRAPPA reconstruction shows a consistent RMSE improvement over GRAPPA reconstruction. The relative RMSE fluctuation for GRAPPA reconstruction in all six trajectories is less than 1.1%, and for SC-GRAPPA is less than 1.2% for all null-space selections. The relative RMSE fluctuation is even smaller at lower acceleration rate. The reconstruction times for GRAPPA and SC-GRAPPA are 0.19 s and 2.0 s, respectively. The reconstruction time for CG-PRUNO varies from 2.0 s to 15 s, depending on the k-space trajectory.

Figure 4:
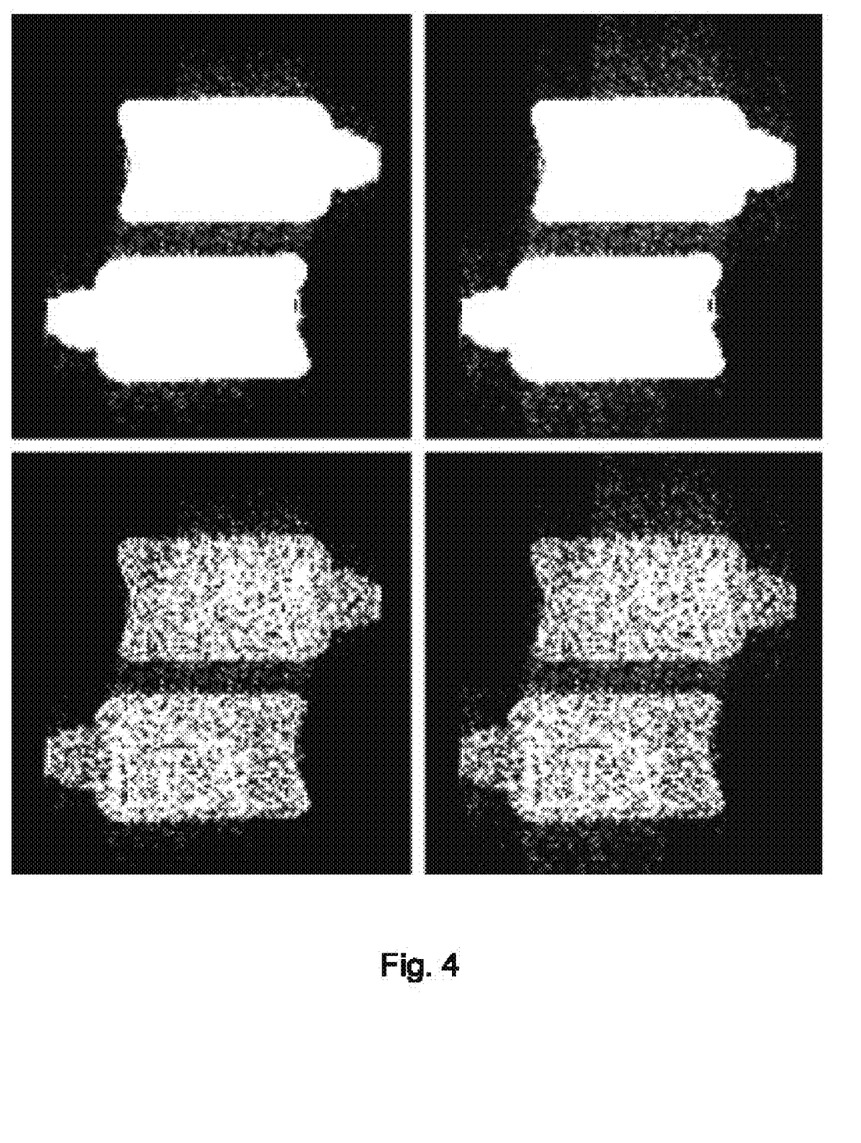
FIG. 4 shows the GRAPPA and SC-GRAPPA reconstructions of data acquired in the phantom and the difference image.

FIG. 4 shows the GRAPPA and SC-GRAPPA reconstructions of data acquired in the phantom, and the difference image. The acceleration rate R=6, the sliding window size was 11×11, and the null-space selection was 48. Note that the noise reduction in the air region was more significant than in regions of the image with high signal.

Figure 5A:
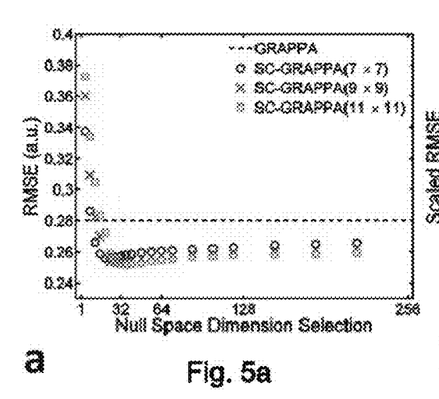
FIG. 5a shows the SC-GRAPPA RMSE vs. null-space selection at accelerate rate R=6.
Figure 5B:
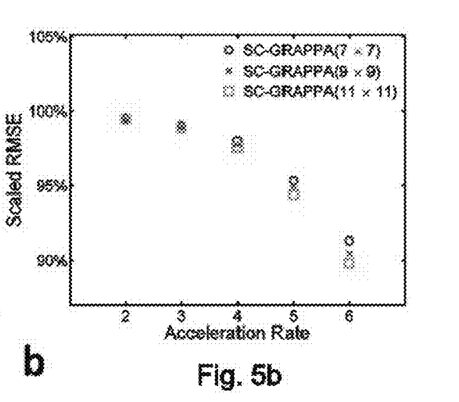
FIG. 5b shows the scaled SC-GRAPPA RMSE vs. acceleration rate.
Figure 5C:
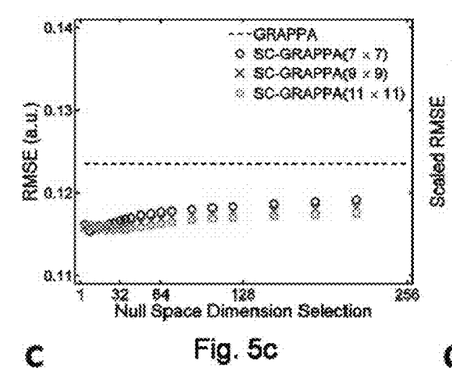
FIGS. 5c and 5d show the results for the conventional GRAPPA acquisition pattern. The RMSE improvement was less sensitive to null-space selection.
Figure 5D:
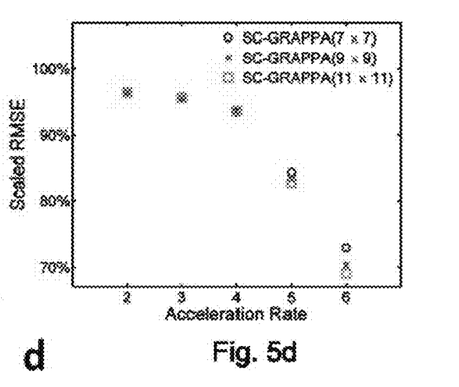

FIG. 5a shows the SC-GRAPPA RMSE vs. null-space selection at accelerate rate R=6. When the null-space was properly selected, the RMSE of SC-GRAPPA was smaller than GRAPPA. FIG. 5b shows the scaled SC-GRAPPA RMSE vs. acceleration rate. The RMSE of GRAPPA reconstruction was set to be 100% for all acceleration rates. SC-GRAPPA shows higher RMSE reduction at high acceleration. FIGS. 5c and 5d show the results for the conventional GRAPPA acquisition pattern. The RMSE improvement was less sensitive to null-space selection. The same results were observed for all three sliding window sizes; 7×7, 9×9, and 11×11. The maximum RMSE reduction was consistently higher when the sliding window was larger. The optimal PRUNO mode selection also increased with the sliding window size.

B. In-vivo Real-Time Cardiac MR Cine Images

Figure 6:
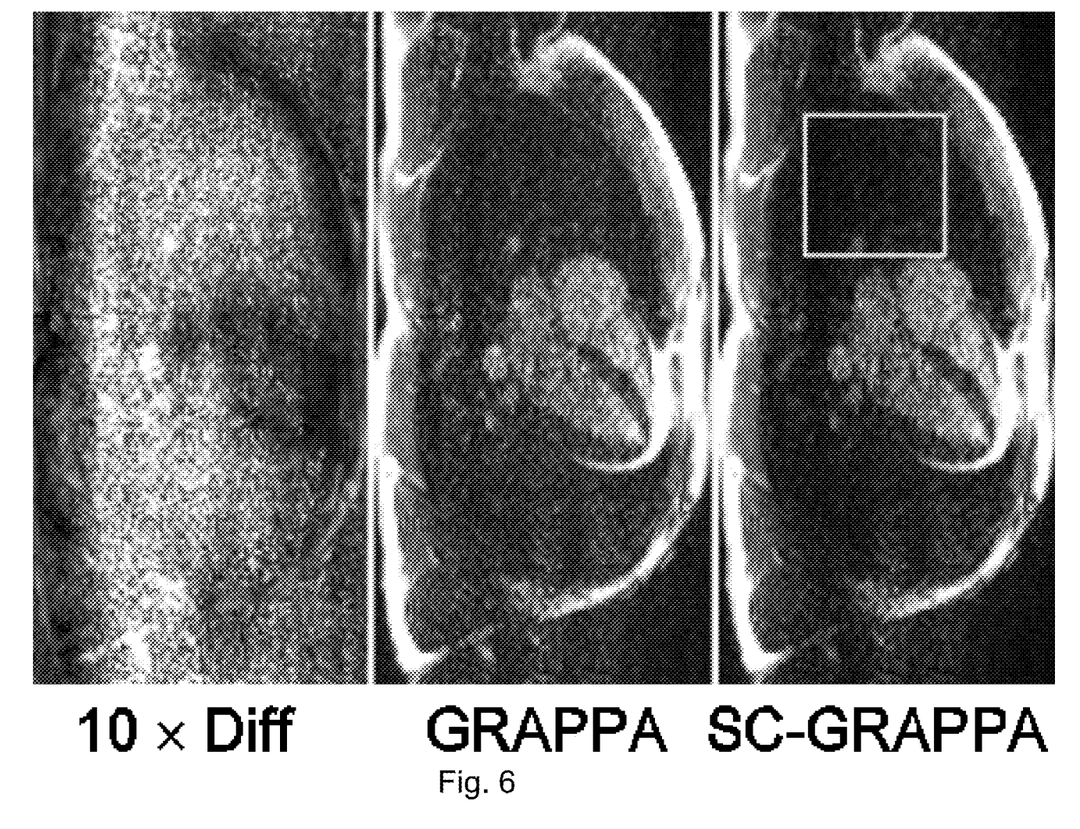
FIG. 6 shows the GRAPPA reconstruction, the SC-GRAPPA reconstruction, and 10 times the difference image in a typical 4-chamber view slice with acceleration rate R=6.

FIG. 6 shows the GRAPPA reconstruction, the SC-GRAPPA reconstruction, and 10 times the difference image in a typical 4-chamber view slice with acceleration rate R=6. The difference image shows that the SNR improvement of SC-GRAPPA was not spatially homogeneous. Low SNR regions of the image showed the highest noise reduction. In the lung region marked in FIG. 6, the noise variance was reduced by 54%, which is more than the effect of averaging two acquisitions. In high SNR regions, e.g. in the chest wall, the SC-GRAPPA reconstruction and the GRAPPA reconstruction were nearly identical. The difference image showed spatially variant noise.

Figure 7:
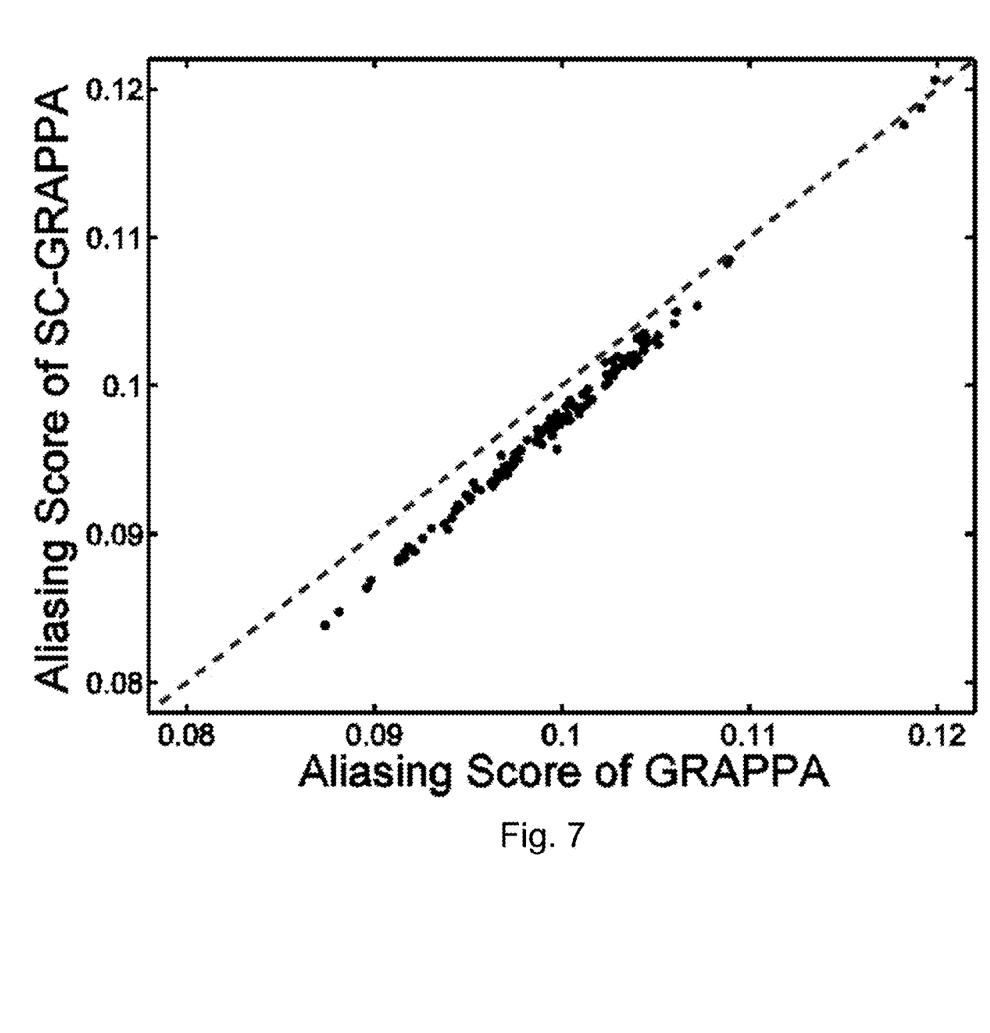
FIG. 7 shows a typical plot of the artifact score of GRAPPA reconstruction vs. the artifact score of SC-GRAPPA reconstruction in the short-axis view with acceleration rate R=6.

FIG. 7 shows a typical plot of the artifact score of GRAPPA reconstruction vs. the artifact score of SC-GRAPPA reconstruction in the short-axis view with acceleration rate R=6. The SC-GRAPPA reconstruction showed significantly lower artifact level (p-value<0.001). At both acceleration rates (R=5 and R=6), the Student t-test showed that the SC-GRAPPA reconstruction had a lower artifacts level than the GRAPPA reconstruction (p-value<0.001).

Table I, below, shows the global SNR gain of SC-GRAPPA over GRAPPA. The SNR improvements are statistically significant (p<0.001) for both acceleration rates R=5 and R=6.

|  |  | Slice 1 | Slice 2 | Slice 3 | Mean |
|---|---|---|---|---|---|
| Volunteer 1 | Rate 5 | 12.6% | 10.9% | 21.9% | 15.13% (p < 0.001) |
|  | Rate 6 | 9.0% | 3.3% | 18.0% | 10.10% (p < 0.001) |
| Volunteer 2 | Rate 5 | 9.8% | 14.6% | 18.9% | 14.43% (p < 0.001) |
|  | Rate 6 | 14.2% | 9.4% | 5.0% | 9.53% (p < 0.001) |

Thus, the present disclosure describes a new channel-by-channel k-space image reconstruction method by incorporating the self-constraint condition into the standard GRAPPA reconstruction method. The SC-GRAPPA framework has a closed-form solution and can be applied whenever GRAPPA can be applied. The technique has overall higher SNR than GRAPPA in real-time dynamic cardiac cine imaging, with higher gain in regions of low SNR. SC-GRAPPA offers improved SNR over GRAPPA and should provide advantages in situations where high acceleration rates are needed.

It should be understood that the various techniques described herein may be implemented in connection with hardware or software or, where appropriate, with a combination of both. Thus, the methods and apparatus of the presently disclosed subject matter, or certain aspects or portions thereof, may take the form of program code (i.e., instructions) embodied in tangible media, such as floppy diskettes, CD-ROMs, hard drives, or any other machine-readable storage medium wherein, when the program code is loaded into and executed by a machine, such as a computer, the machine becomes an apparatus for practicing the presently disclosed subject matter. In the case of program code execution on programmable computers, the computing device generally includes a processor, a storage medium readable by the processor (including volatile and non-volatile memory and/or storage elements), at least one input device, and at least one output device. One or more programs may implement or utilize the processes described in connection with the presently disclosed subject matter, e.g., through the use of an API, reusable controls, or the like. Such programs are preferably implemented in a high level procedural or object oriented programming language to communicate with a computer system. However, the program(s) can be implemented in assembly or machine language, if desired. In any case, the language may be a compiled or interpreted language, and combined with hardware implementations.

Although example embodiments may refer to utilizing aspects of the presently disclosed subject matter in the context of one or more stand-alone computer systems, the subject matter is not so limited, but rather may be implemented in connection with any computing environment, such as a network or distributed computing environment. Still further, aspects of the presently disclosed subject matter may be implemented in or across a plurality of processing chips or devices, and storage may similarly be effected across a plurality of devices. Such devices might include personal computers, network servers, and handheld devices, for example.

Although the subject matter has been described in language specific to structural features and/or methodological acts, it is to be understood that the subject matter defined in the appended claims is not necessarily limited to the specific features or acts described previously. Rather, the specific features and acts described previously are disclosed as example forms of implementing the claims.

What is claimed:

1. A method of determining a Self-Constraint (SC) GeneRalized Autocalibrating Partially Parallel Acquisition (GRAPPA) reconstruction, comprising:
    sampling k-space data as a set of ACS lines acquired from a magnetic resonance imaging (MRI) apparatus;
    estimating a GRAPPA kernel from the ACS lines;
    estimating a null projection matrix N from the ACS lines;
    performing a GRAPPA reconstruction to calculate $k_0$, which represents the GRAPPA reconstruction;
    calculating a k-space of the SC-GRAPPA in accordance with the GRAPPA reconstruction and a self-constraint condition defined by local k-space correlations among acquired and unacquired k-space samples, the self-constraint condition being a set of linear equations determined in accordance with correlations within missing k-space data, as follows:

$k = k_0 + w$, and $0 = Nk + v$;

wherein w and v are random noise terms, wherein k is vectorized local k-space data, and
    wherein calculating the k-space of the SC-GRAPPA is performed in accordance with:

$k = k_0 - RN^T(Q + NRN^T)^{-1} Nk_0$, wherein Q and R are covariance matrices of w and v, respectively; and
    performing image reconstruction by transforming the k-space of the SC-GRAPPA into MRI image data that is displayed in a human comprehensible format.

2. The method of claim 1, further comprising estimating the GRAPPA kernel using a linear regression.

3. The method of claim 1, further comprising estimating the null projection matrix N using a parallel reconstruction using null operations (PRUNO) method.

4. The method of claim 3, wherein the null projection matrix is defined by:

$$\begin{bmatrix} 0 \\ 0 \end{bmatrix} = \begin{bmatrix} N_{11} & N_{12} \\ N_{21} & N_{22} \end{bmatrix} \begin{bmatrix} k_{acq} \\ k_{unacq} \end{bmatrix},$$

wherein $k_{unacq}$ and $k_{acq}$ are vectorized unacquired and acquired k-space data, respectively.

5. The method of claim 1, wherein the k-space of the SC-GRAPPA is reconstructed using a least squares problem with prior estimation.

6. The method of claim 5, wherein the prior estimation is $k_0$.

7. The method of claim 1, further comprising applying a channel combination using either the sum-of-squares or B1-weighted summation.

8. A nontransitory computer-readable medium having computer executable instructions stored thereon that when executed by a processor of a computing device determines a Self-Constraint (SC) GeneRalized Autocalibrating Partially Parallel Acquisition (GRAPPA) reconstruction, comprising:

sampling k-space data, including a set of ACS lines acquired from a magnetic resonance imaging (MRI) apparatus;

estimating a GRAPPA kernel from the ACS lines;

estimating a null projection matrix N from the ACS lines;

performing a GRAPPA reconstruction to calculate $k_0$, which represents the GRAPPA reconstruction;

calculating a k-space of the SC-GRAPPA in accordance with the GRAPPA reconstruction and a self-constraint condition defined by local k-space correlations among acquired and unacquired k-space samples, the self-constraint condition being a set of linear equations determined in accordance with correlations within missing k-space data, as follows:

$k = k_0 + w$, and $0 = Nk + v$, wherein w and v are random noise terms, wherein k is vectorized local k-space data, and wherein calculating the k-space of the SC-GRAPPA is performed in accordance with:

$k = k_0 - RN^T(Q + NRN^T)^{-1} Nk_0$, wherein Q and R are covariance matrices of w and v, respectively; and performing image reconstruction by transforming the k-space of the SC-GRAPPA into MRI image data that is displayed in a human comprehensible format.

9. The nontransitory computer-readable medium of claim 8, further comprising estimating the null projection matrix N using a parallel reconstruction using null operations (PRUNO) method.

10. The nontransitory computer-readable medium of claim 8, wherein the k-space of the SC-GRAPPA is reconstructed using a least squares problem with prior estimation.

11. The nontransitory computer-readable medium of claim 10, wherein the prior estimation is $k_0$.

12. The nontransitory computer-readable medium of claim 8, further comprising applying a channel combination using either the sum-of-squares or B1-weighted summation.

13. An apparatus for determining a Self-Constraint (SC) GeneRalized Autocalibrating Partially Parallel Acquisition (GRAPPA) reconstruction, comprising:

a memory;

a processor executing computer executable instructions in the memory, the computer executable instructions, wherein the apparatus samples k-space data on a set of ACS lines acquired from a magnetic resonance imaging (MRI) apparatus, estimates a GRAPPA kernel from the ACS lines, estimates a null projection matrix N from the ACS lines, performs a GRAPPA reconstruction to calculate k0, which represents the GRAPPA reconstruction, and calculates a k-space of the SC-GRAPPA in accordance with the GRAPPA reconstruction and a self-constraint condition defined by local k-space correlations among acquired and unacquired k-space samples, the self-constraint condition being a set of linear equations determined in accordance with correlations within missing k-space data, as follows:

$k = k_0 + w$, and $0 = Nk + v$, wherein w and v are random noise terms, wherein k is vectorized local k-space data, and wherein calculating the k-space of the SC-GRAPPA is performed in accordance with:

$k = k_0 - RN^T(Q + NRN^T)^{-1} Nk_0$, wherein Q and R are covariance matrices of w and v, respectively; and performing image reconstruction by transforming the k-space of the SC-GRAPPA into MRI image data that is displayed in a human comprehensible format.

* * * * *